(12) United States Patent
Kim

(10) Patent No.: US 8,022,528 B2
(45) Date of Patent: Sep. 20, 2011

(54) STACK-TYPE SEMICONDUCTOR PACKAGE AND ELECTRONIC SYSTEM INCLUDING THE SAME

(75) Inventor: Tae-Hun Kim, Cheonan-si (KR)

(73) Assignee: SAMSUNG Electronics Co., Ltd., Suwon-si (KR)

(*) Notice: Subject to any disclaimer, the term of this patent is extended or adjusted under 35 U.S.C. 154(b) by 0 days.

(21) Appl. No.: 12/952,434

(22) Filed: Nov. 23, 2010

(65) Prior Publication Data
US 2011/0063805 A1    Mar. 17, 2011

Related U.S. Application Data

(62) Division of application No. 12/201,160, filed on Aug. 29, 2008, now Pat. No. 7,851,259.

(30) Foreign Application Priority Data

Aug. 31, 2007 (KR) .................................. 2007-88363

(51) Int. Cl.
  *H01L 23/02*    (2006.01)
  *H01L 23/48*    (2006.01)
  *H01L 23/52*    (2006.01)
  *H01L 23/28*    (2006.01)
(52) U.S. Cl. ........ 257/686; 257/778; 257/779; 257/786; 257/787
(58) Field of Classification Search .................. None
See application file for complete search history.

(56) References Cited

U.S. PATENT DOCUMENTS

| 5,608,265 | A  | * | 3/1997 | Kitano et al. | .................. 257/738 |
| 7,748,116 | B2 | * | 7/2010 | Trezza | ............................. 29/878 |
| 2008/0157328 | A1 | * | 7/2008 | Kawata | ......................... 257/686 |

FOREIGN PATENT DOCUMENTS

| JP | 2004-349495 | 12/2004 |
| JP | 2006-120935 | 5/2006 |
| JP | 2006-303079 | 11/2006 |
| KR | 2006-49094 | 5/2006 |
| KR | 10-652397 | 7/2006 |

\* cited by examiner

*Primary Examiner* — Scott B Geyer
(74) *Attorney, Agent, or Firm* — Stanzione & Kim, LLP

(57) ABSTRACT

A method of forming a stack-type semiconductor package includes preparing a lower printed circuit board including a plurality of interconnections and a plurality of ball lands for connection on an upper surface thereof. One or more first chips, which are electrically connected to the plurality of interconnections and sequentially stacked, are mounted on the lower printed circuit board. A lower molded resin compound is formed on the lower printed circuit board to cover the first chips, and is formed to have via holes exposing the ball lands for connection. An upper chip package, under which solder balls are formed, is aligned so that the solder balls correspond to the via holes of the lower molded resin compound, respectively. The solder balls are reflown to form connection conductors filling the via holes. A stack-type semiconductor package structure and an electronic system including the same are also provided.

20 Claims, 17 Drawing Sheets

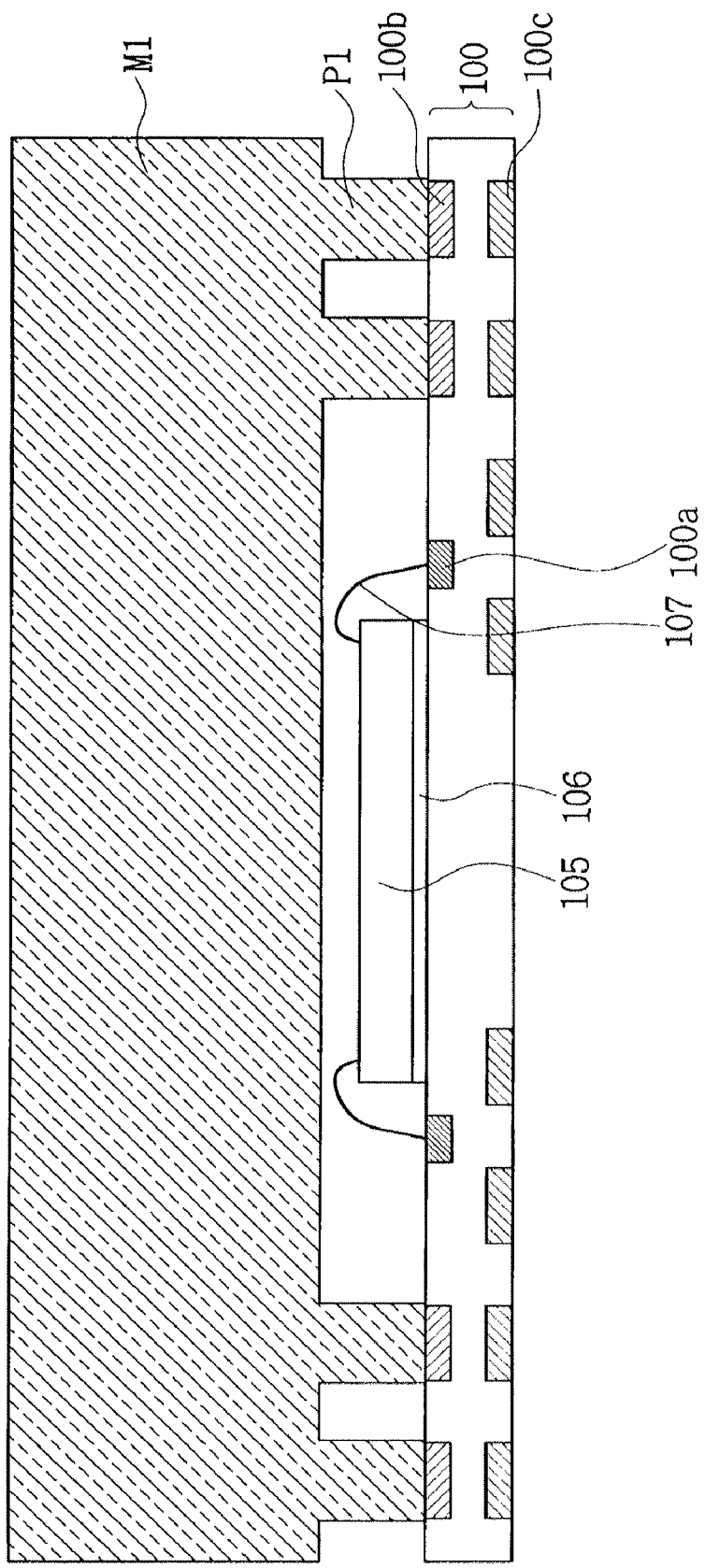

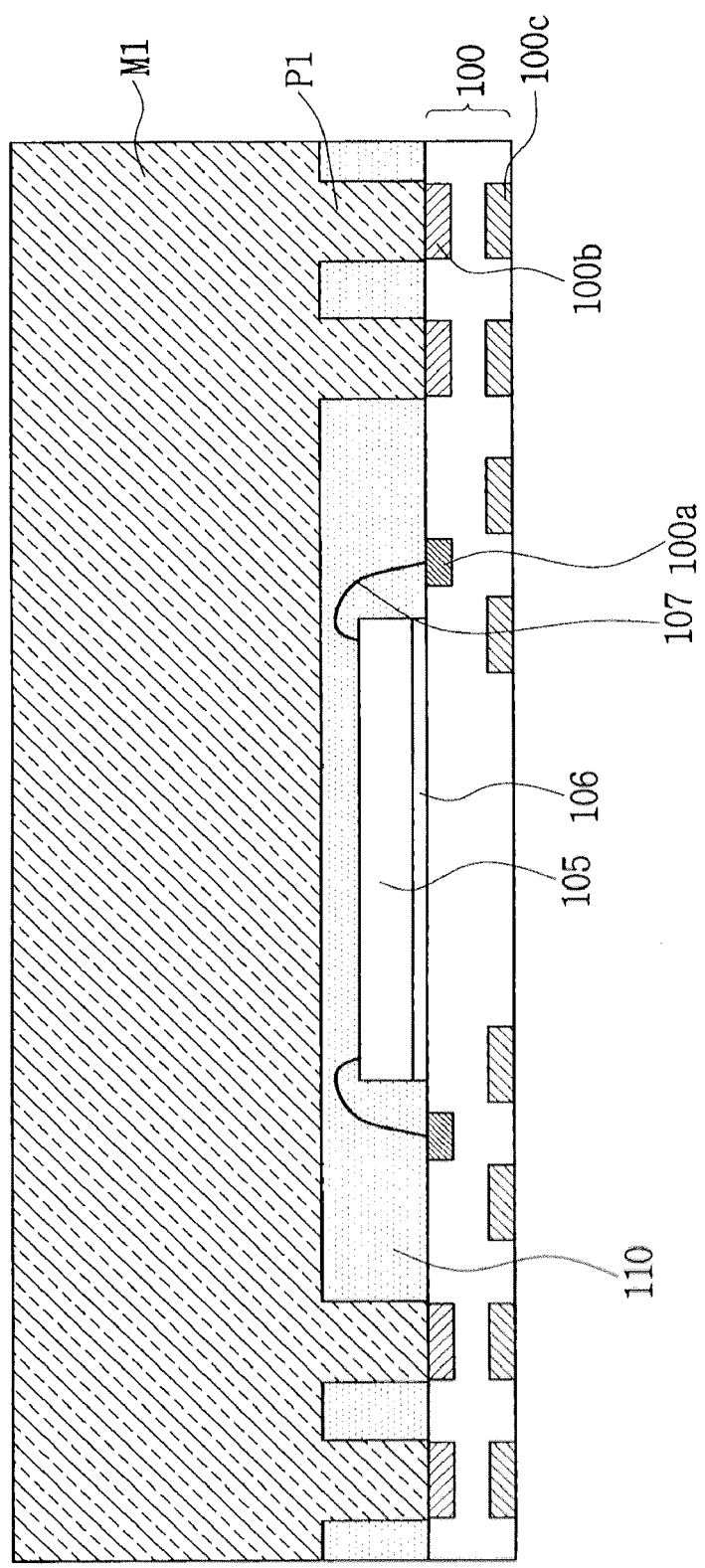

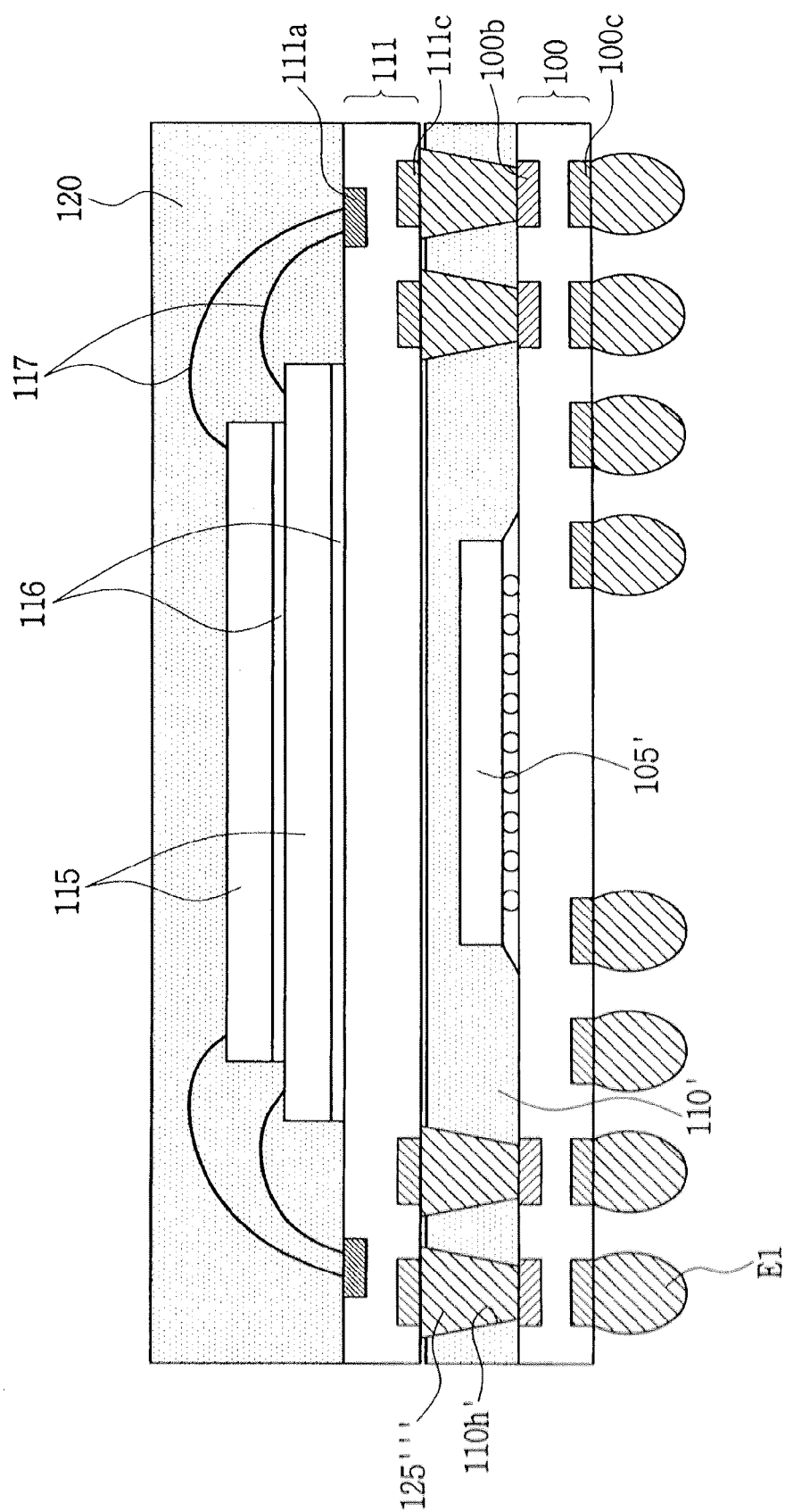

STACK-TYPE SEMICONDUCTOR PACKAGE AND ELECTRONIC SYSTEM INCLUDING THE SAME

CROSS-REFERENCE TO RELATED APPLICATIONS

This application is a divisional application of Ser. No. 12/201,160 filed on Aug. 29, 2008, which issued as U.S. Pat. No. 7,851,259 on Dec. 14, 2010, and which claims priority under 35 U.S.C. §119(a) from Korean Patent Application No. 10-2007-0088363, filed on Aug. 31, 2007, the contents of which are hereby incorporated herein by reference in its entirety.

BACKGROUND OF THE INVENTION

1. Field of the Invention

The present general inventive concept relates to a semiconductor package, a method of forming the same, and an electronic system including the same, and more particularly, to a stack-type semiconductor package, a method of forming the same, and an electronic system including the same.

2. Description of the Related Art

In order to expand capacities and functions, integrity density of a semiconductor package is getting increased in a wafer state, and a semiconductor package, in which two or more semiconductor chips or semiconductor packages are integrated into one, is generalized. Expanding the capacities and functions of a semiconductor device in a wafer state requires considerable equipment investment and costs in a process of manufacturing wafers, and has a lot of problems that may be caused during the processes to be solved.

However, after semiconductor chips are completely fabricated, integrating two or more semiconductor chips or two or more semiconductor packages into one can be accomplished in a process of assembling a semiconductor package without solving the above problems. Also, compared to the method of expanding the capacities and functions in a wafer state, the method can be achieved with low equipment investment and cost, and thus research into an integrated-type semiconductor package such as System In Package (SIP), Multi Chip Package (MCP), and Package On Package (POP) is actively progressing in the semiconductor device manufacturing field.

SUMMARY OF THE INVENTION

The present general inventive concept provides a stack-type semiconductor package capable of electrically connecting a lower semiconductor package to an upper semiconductor package, high pin-count for improving integration density in stacking, and preventing a bridge defect that is caused when neighboring solder balls are in contact with each other and a non-wet defect, which causes upper solder balls not to be in contact with lower semiconductor package, a method of forming the same, and an electronic system including the same.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by providing a stack-type semiconductor package includes a lower printed circuit board having a plurality of interconnections and a plurality of ball lands for connection on an upper surface thereof. One or more first chips, which are electrically connected to the plurality of interconnection and sequentially stacked, are disposed on the lower printed circuit board. A lower molded resin compound is disposed on the lower printed circuit board to cover the first chips. Connection conductors passing through the lower molded resin compound to be in contact with the ball lands for connection are disposed. An upper printed circuit board including lower pads that are in contact with upper surfaces of the connection conductors is disposed on the lower molded resin compound. One or more second chips, which are electrically connected to the upper printed circuit board and sequentially stacked, are disposed on the upper printed circuit board. An upper molded resin compound covering the upper printed circuit board having the second chips is disposed.

The lower printed circuit board, the first chips, and the lower molded resin compound may constitute a lower chip package, and the upper printed circuit board, the second chips, and the upper molded resin compound may constitute an upper chip package.

One or more intermediate chip packages may be further included between the lower chip package and the upper chip package, wherein the intermediate chip package may be electrically connected to the upper chip package through an intermediate connection conductor.

Electrodes may be disposed under the lower printed circuit board.

The chips may be connected to the printed circuit board in a wire bonding structure or a flip-chip structure.

The lower molded resin compound may have a planar upper surface.

The lower molded resin compound may have an upper surface having a step difference, and upper regions of the lower molded resin compound corresponding to the first chips may have upper surfaces higher than other regions.

The molded resin compound may include an epoxy molded compound.

The connection conductors may be materials including tin (Sn).

The method includes preparing a lower printed circuit board including a plurality of interconnections and a plurality of ball lands for connection on an upper surface thereof. One or more first chips, which are electrically connected to the plurality of interconnections and sequentially stacked, are mounted on the lower printed circuit board. A lower molded resin compound is formed on the lower printed circuit board to cover the first chips, and is formed to have via holes exposing the ball lands for connection. An upper chip package, under which solder balls are formed, is aligned so that the solder balls correspond to the via holes of the lower molded resin compound, respectively. The solder balls are reflown to form connection conductors filling the via holes.

Forming the lower molded resin compound may include covering a mold having pins that are in contact with the ball lands for connection on the lower printed circuit board having the first chips. Then, a molten lower molded resin compound may be injected into one side of the mold. The molten lower molded resin compound may be flown in an opposite direction where the molten lower molded resin compound is injected to fill spaces between the lower printed circuit board and the mold and harden the molten lower molded resin compound. The mold may be removed to form via holes that expose the ball lands for connection, respectively.

Forming the upper chip package may include preparing an upper printed circuit board including lower pads. Then, one or more second chips, which are electrically connected to the upper printed circuit board and sequentially stacked, may be formed on the upper printed circuit board, and an upper molded resin compound covering the upper printed circuit board having the second chips may be formed. Solder balls may be formed to correspond to the lower pads, respectively.

The lower printed circuit board, the first chips, and the lower molded resin compound may constitute a lower chip package.

The method may further include stacking one or more intermediate chip packages between the lower chip package and the upper chip package using an intermediate connection conductor.

Electrodes may be formed under the lower printed circuit board after forming the lower molded resin compound.

The first chips may be formed to be connected to the interconnections of the lower printed circuit board in a wire bonding structure or a flip-chip structure.

The lower molded resin compound may be formed to have a planar upper surface.

The lower molded resin compound may be formed to have an upper surface having a step difference, and upper regions of the lower molded resin compound corresponding to the first chips may be formed to have upper surfaces higher than other regions.

The molded resin compound may include an epoxy molded compound.

The connection conductors may be formed of materials including Sn.

The foregoing and/or other aspects and utilities of the general inventive concept may also be achieved by providing an electronic system including a processor, and an input/output unit and one or more stack-type semiconductor packages which perform data communication with the processor, the stack-type semiconductor package includes a lower printed circuit board having a plurality of interconnections and a plurality of ball lands for connection on an upper surface thereof. One or more first chips, which are electrically connected to the plurality of interconnections and sequentially stacked, are disposed on the lower printed circuit board. A lower molded resin compound is disposed on the lower printed circuit board to cover the first chips. Connection conductors passing through the lower molded resin compound to be in contact with the ball lands for connection are disposed. An upper printed circuit board including lower pads that are in contact with upper surfaces of the connection conductors is disposed on the lower molded resin compound. One or more second chips, which are electrically connected to the upper printed circuit board and sequentially stacked, are disposed on the upper printed circuit board. An upper molded resin compound covering the upper printed circuit board having the second chips is disposed.

The lower printed circuit board, the first chips, and the lower molded resin compound may constitute a lower chip package, and the upper printed circuit board, the second chips, and the upper molded resin compound may constitute an upper chip package.

One or more intermediate chip packages may be further included between the lower chip package and the upper chip package, wherein the intermediate chip package may be electrically connected to the upper chip package through an intermediate connection conductor.

The lower chip package may be a logic package, and the intermediate chip package and the upper chip package may be memory packages.

A board, in which the processor and the stack-type semiconductor package are mounted, may be further included.

Electrodes disposed under the lower printed circuit board may be further included, wherein the lower printed circuit board may be electrically connected to the board through the electrodes.

The foregoing and/or other aspects and utilities of the general inventive concept may also be achieved by providing a memory module includes a board body including a plurality of tabs at one side, and stack-type semiconductor packages mounted on the board body in an array of two or more columns. Here, each of the stack-type semiconductor packages includes a lower printed circuit board having a plurality of interconnections and a plurality of ball lands for connection on an upper surface thereof. One or more first chips, which are electrically connected to the plurality of interconnections and sequentially stacked, are disposed on the lower printed circuit board. A lower molded resin compound is disposed on the lower printed circuit board to cover the first chips. Connection conductors passing through the lower molded resin compound to be in contact with the ball lands for connection are disposed. An upper printed circuit board including lower pads that are in contact with upper surfaces of the connection conductors is disposed on the lower molded resin compound. One or more second chips, which are electrically connected to the upper printed circuit board and sequentially stacked, are disposed on the upper printed circuit board. An upper molded resin compound covering the upper printed circuit board having the second chips is disposed.

Discrete devices, which is disposed on the board body to be spaced apart from the stack-type semiconductor packages, may be further included.

The discrete devices may include at least one selected from the group consisting of a register, a capacitor, an inductor, a resistor, a programmable device, and a non-volatile memory device.

The foregoing and/or other aspects and utilities of the general inventive concept may also be achieved by providing a stack-type semiconductor package including a plurality of chip packages to stack one each other, a plurality of ball lands and via holes corresponding to the ball lands on one of the plurality of chip packages, and a plurality of solder balls on an other of the plurality of chip packages to correspond with the via holes on the one chip package, wherein the corresponding solder balls and via holes engage each other to form connection conductors.

The connection conductors may be formed by reflowing the solder balls to fill the via holes.

The foregoing and/or other aspects and utilities of the general inventive concept may also be achieved by providing a method of forming a stack-type semiconductor package, the method including forming a plurality of ball lands and via holes corresponding to the ball lands on a chip package, forming a plurality of solder balls on an other chip package to correspond with the via holes on the one chip package, engaging the via holes of the chip package and the corresponding solder balls of the other chip package with each other, and reflowing the solder balls to fill the corresponding via holes to form connection conductors.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:

FIGS. 3A to 3E are cross-sectional views taken along line I-I' of FIG. 1, illustrating a method of forming a stack-type semiconductor package according to example embodiments of the present general inventive concept.

FIG. 4B is a cross-sectional view illustrating a method of forming a stack-type semiconductor package according to still other example embodiments of the present general inventive concept.

DETAILED DESCRIPTION OF THE PREFERRED EMBODIMENTS

Figure 1:
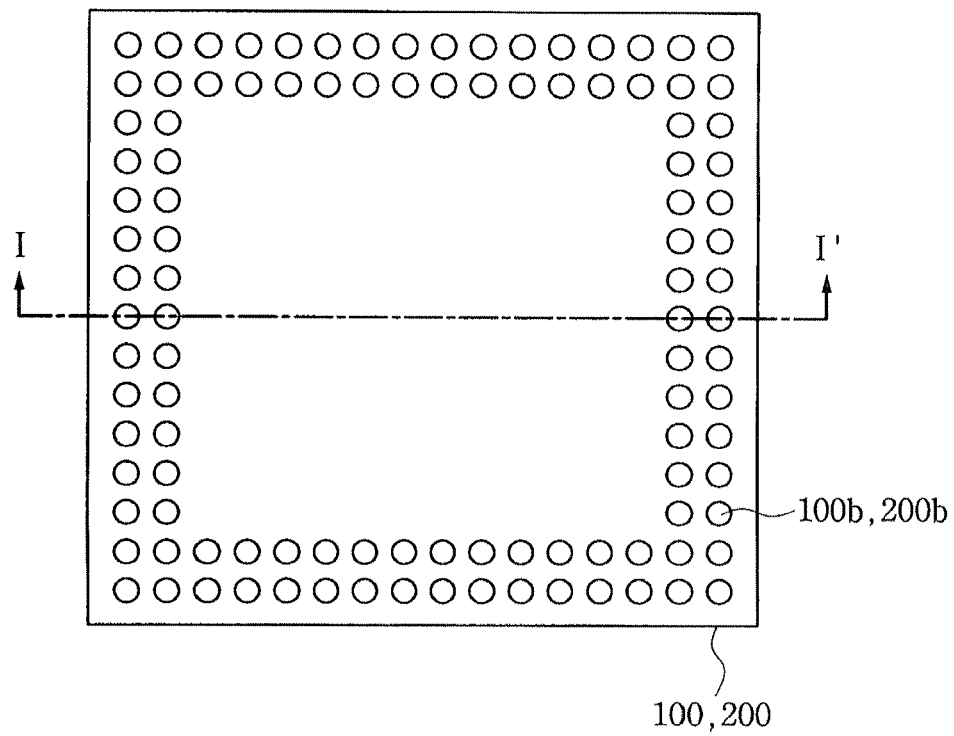
FIG. 1 is a plan view illustrating a stack-type semiconductor package according to example embodiments of the present general inventive concept.

The present general inventive concept will now be described more fully hereinafter with reference to the accompanying drawings, in which example embodiments of the general inventive concept are illustrated. This general inventive concept may, however, be embodied in different forms and should not be construed as limited to the example embodiments set forth herein. Rather, these example embodiments are provided so that this disclosure will be thorough and complete, and will fully convey the scope of the general inventive concept to those skilled in the art. In the drawings, the thickness of layers and regions may be exaggerated for clarity. Also, when it is referred that a layer is "on" another layer or a substrate, it may be directly formed on another layer or the substrate or a third layer may be interposed therebetween.

Reference will now be made in detail to embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
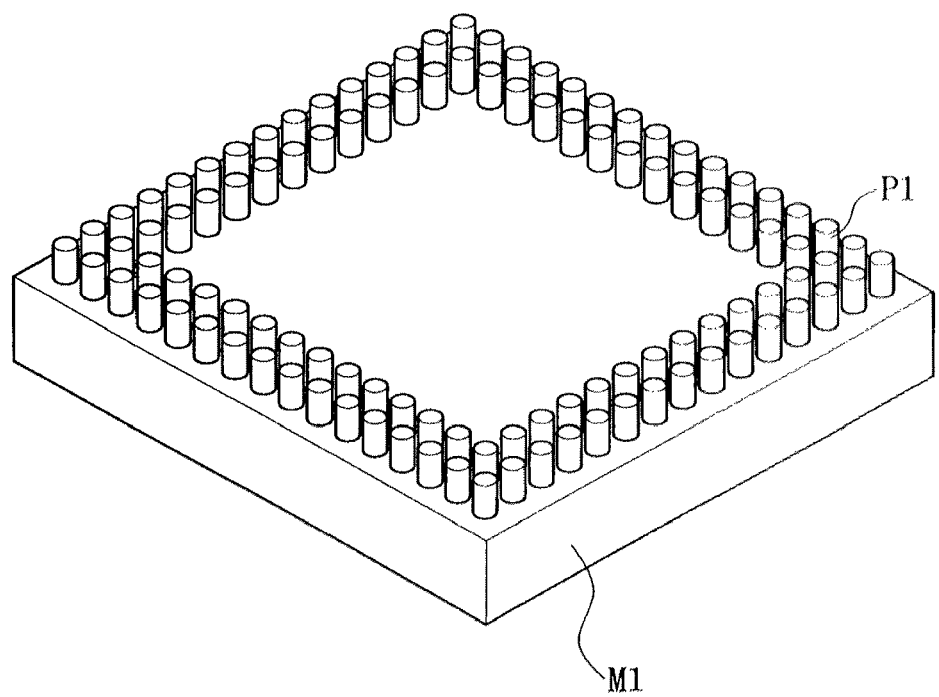
FIG. 2 is a perspective view illustrating a mold to form a lower molded resin compound in a method of forming a stack-type semiconductor package according to example embodiments of the present general inventive concept.

FIG. 1 is a plan view illustrating a lower printed circuit board of a stack-type semiconductor package according to example embodiments of the present general inventive concept, and FIG. 2 is a perspective view illustrating a mold to form a lower molded resin compound in a method of forming a stack-type semiconductor package according to example embodiments of the present general inventive concept. Also, FIG. 3A to 3E are cross-sectional views taken along line I-I' of FIG. 1, illustrating a method of forming a stack-type semiconductor package according to example embodiments of the present general inventive concept.

Referring to FIGS. 1, 2, and 3A, a method of forming a stack-type semiconductor package according to example embodiments of the present general inventive concept includes preparing a lower printed circuit board 100 including a plurality of interconnections 100a and a plurality of ball lands 100b for connection on an upper surface thereof. The lower printed circuit board 100 may further include lower pads 100c on a lower surface. One or more first chips 105 that are sequentially stacked are mounted on the upper surface of the lower printed circuit board 100. Backside surfaces of the first chips 105 may be in contact with an upper surface of the lower printed circuit board 100 by an adhesive 106. Sequentially, pads of the first chips 105 may be electrically connected to the plurality of interconnections 100a formed on the lower printed circuit board 100 through wires 107. Alternatively, the first chips 105 may be electrically connected to the lower printed circuit board 100 in a flip-chip structure.

A mold M1 having a plurality of pins P1 illustrated in FIG. 2 is covered on the lower printed circuit board 100 having the first chips. The mold M1 having the plurality of pins P1 may be fabricated such that the ball lands 100b for connection are aligned with the pins P1. Accordingly, the pins P1 can be in contact with the ball lands 100b for connection of the lower printed circuit board 100, respectively. The pins P1 may have a circular, oval, rectangular, hexagonal or diamond shape when viewed from a plan view. Also, when viewed from a cross-sectional view, the pins P1 may have a shape of a rectangle or a reversed trapezoid. Cylindrical pins P1 are illustrated in FIG. 3 as an example embodiment of the present general inventive concept. A plate of the mold M1 may have a planar surface or a recessed region between the pins P1.

Referring to FIGS. 1, 2 and 3B, a molten lower molded resin compound 110 may be injected into one side of the mold M1. The molten lower molded resin compound 110 may include an epoxy molded compound or liquid epoxy. The molten lower molded resin compound 110 may flow in an opposite direction where the molten lower molded resin compound 110 is injected to fill spaces between the lower printed circuit board 100 and the mold M1. Here, air can go out through the vent. The molten lower molded resin compound 110 fills every empty space between the pins P1.

Figure 3C:
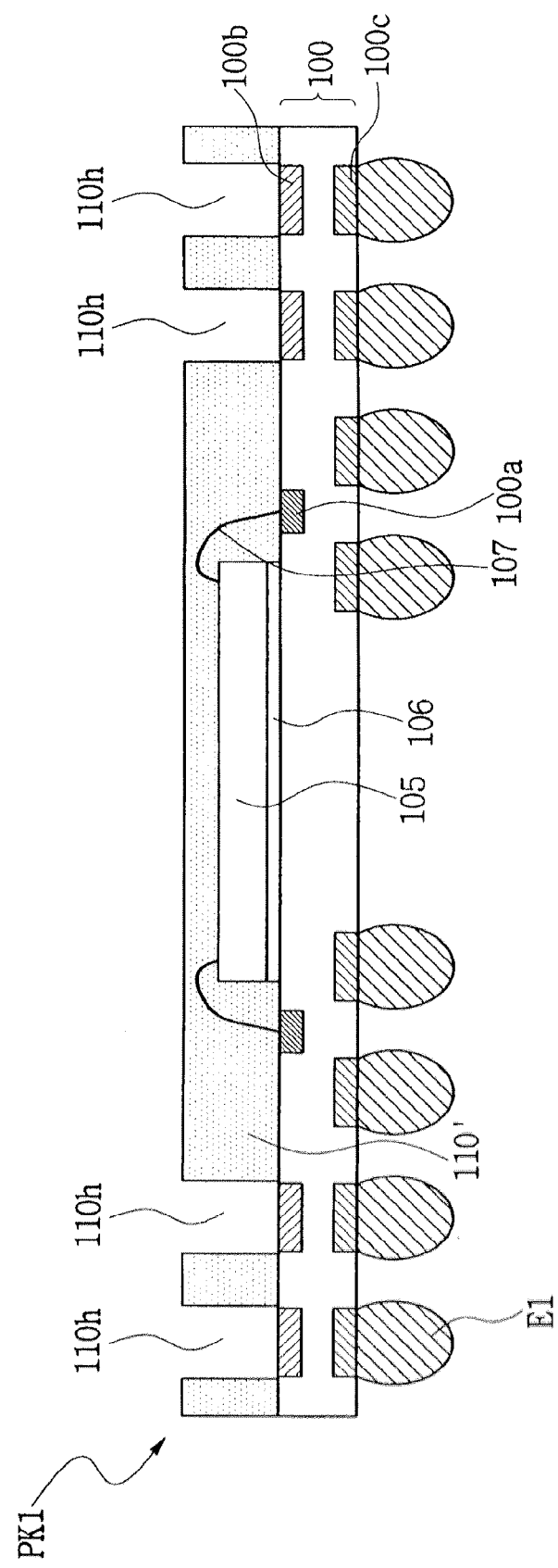

Referring to FIGS. 1 and 3C, the molten lower molded resin compound 110 may be hardened to form a hard lower molded resin compound 110'. The, the mold M1 having the pins P1 may be removed. As a result, via holes 110h passing through the lower molded resin compound 110' and exposing each of the balls lands 100b for connection of the lower printed circuit board 100 may be formed. The shape of the via holes 110h may be determined depending on a shape of the pins P1. The lower molded resin compound 110' may be formed to have a planar upper surface. Alternatively, when the mold M1 has a recessed region, an upper surface of the lower molded resin compound 110' may be formed to have a step difference. In particular, upper region of the lower molded resin compound 110' corresponding to the first chips 105 may be formed to have upper surfaces higher than other regions.

Electrodes E1 may be formed on the lower pads 100c of the lower printed circuit board 100. The electrodes E1 may be formed of solder balls. The lower printed circuit board 100, the first chips 105, and the lower molded resin compound 110' may constitute a lower chip package PK1.

Figure 3D:
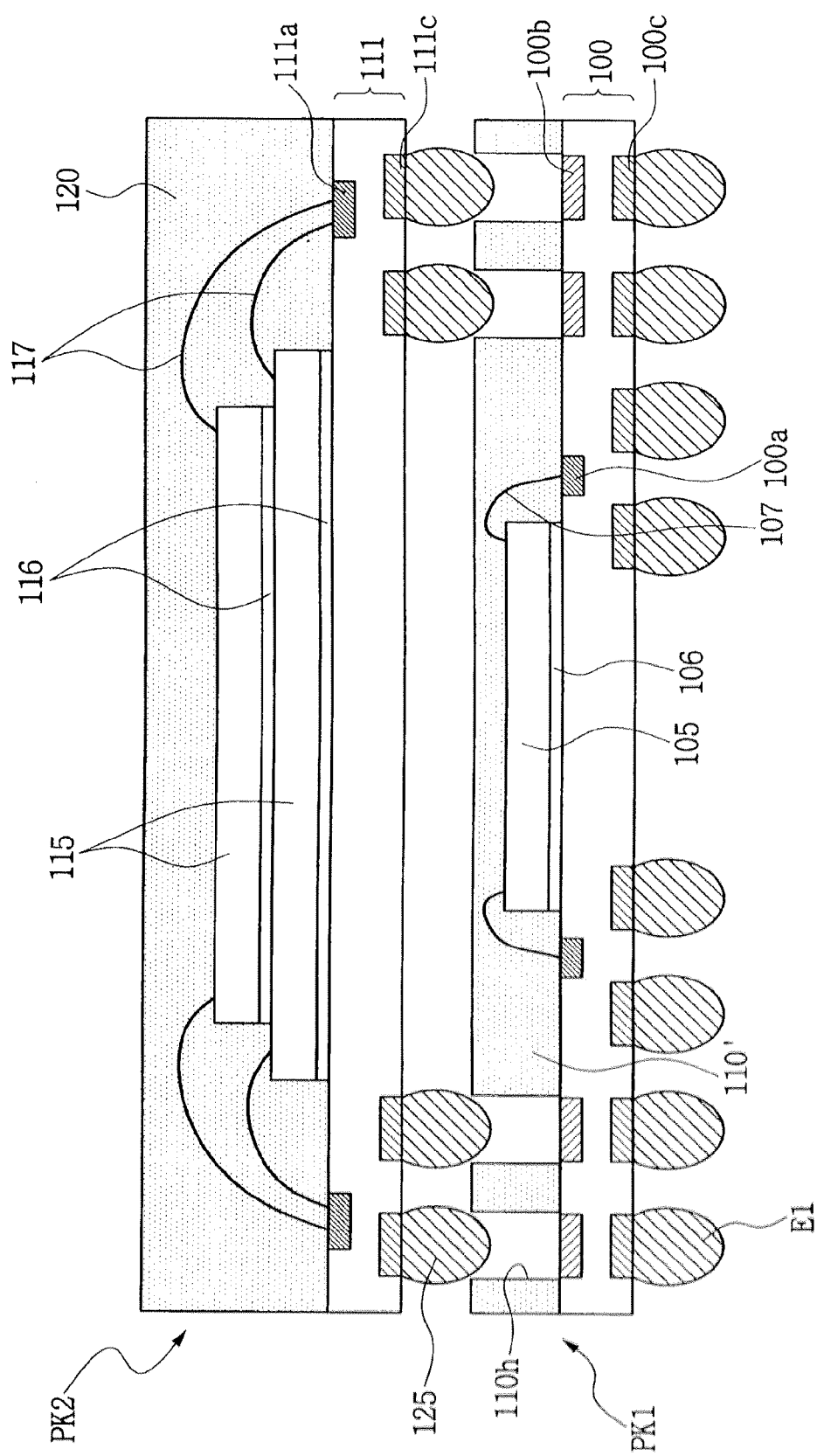

Referring to FIGS. 1 and 3D, an upper chip package PK2, under which upper solder balls 125 are attached, is aligned on the lower molded resin compound 110' so that the solder balls 125 correspond to the via holes 110h, respectively. A formation of the upper chip package PK2 may include preparing an upper printed circuit board 111 including lower pads 111c and interconnections 111a. Sequentially, one or more second chips 115 that are electrically connected to the upper printed circuit board 111 and sequentially stacked may be formed on the upper printed circuit board 111.

Backside surfaces of the second chips 115 may be in contact with an upper surface of the upper printed circuit board 111 through adhesives 116. Then, pads of the second chips 115 may be electrically connected to the plurality of interconnections 111a formed on the upper printed circuit board 111 through wires 117. Alternatively, the second chips 115 may be electrically connected to the upper printed circuit board 111 in a flip-chip structure. An upper molded resin compound 120 covering the upper printed circuit board 111 having the second chips 115 may be formed. The upper solder balls 125 that are respectively in contact with the lower pads 111c may be formed. The upper solder balls 125 may be formed of a material containing tin (Sn).

Figure 3E:
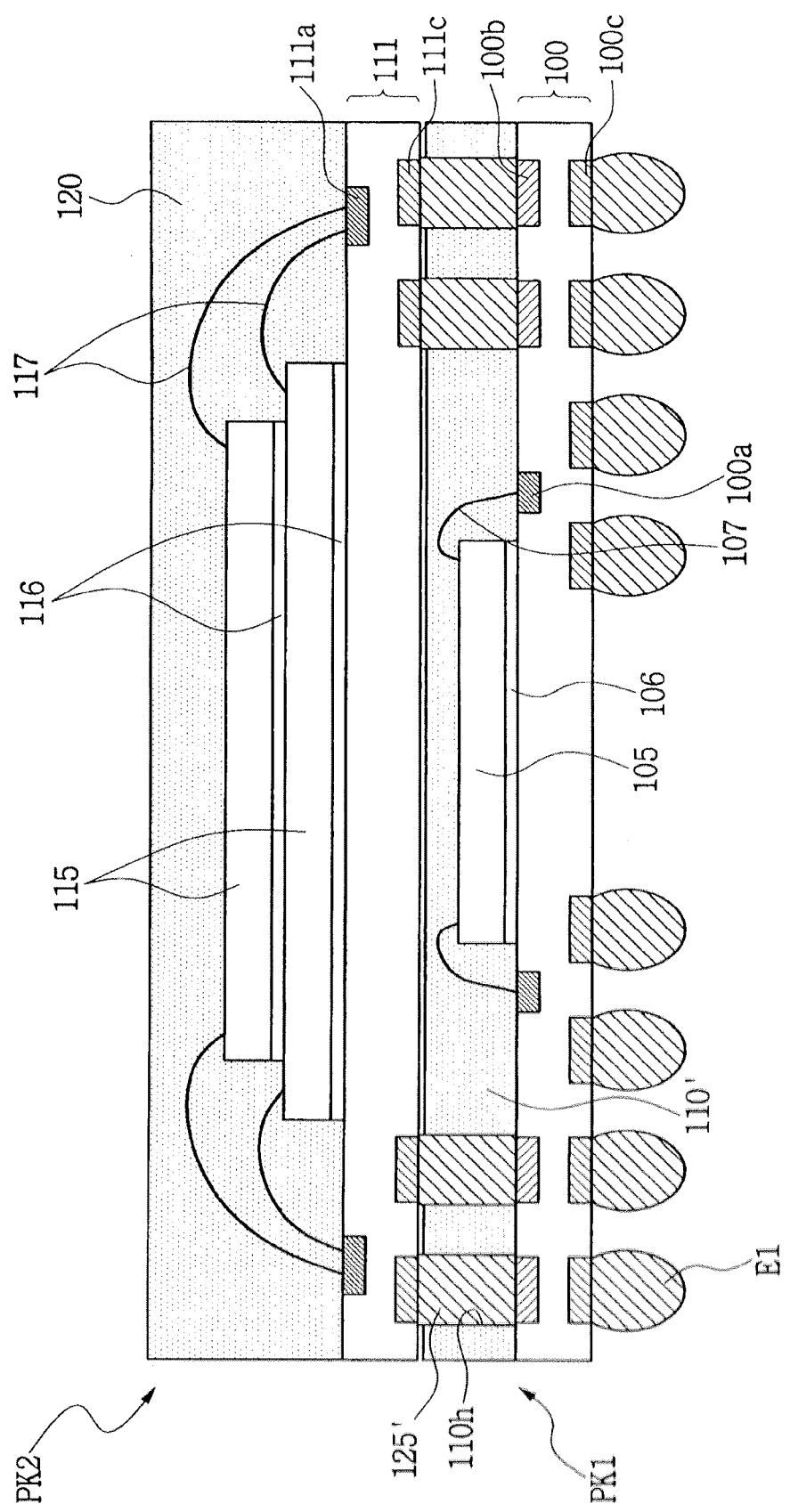

Referring to FIGS. 1 and 3E, the upper solder balls 125 may be reflown to form connection conductors 125' filling the via holes 110h. The lower chip package PK1 and the upper chip package PK2 are electrically connected to each other by the connection conductors 125', so that a stack-type semiconductor package having a POP structure can be formed. The upper chip package PK2 may be in direct contact with an upper surface of the lower molded resin compound 110' of the lower chip package PK1 depending on an amount of the upper solder balls 125. Alternatively, when the amount of the upper solder balls is sufficient to fill the via holes 110h and to remain, the upper chip package PK2 may be disposed to be spaced apart from the upper surface of the lower molded resin compound 110'.

Figure 4A:
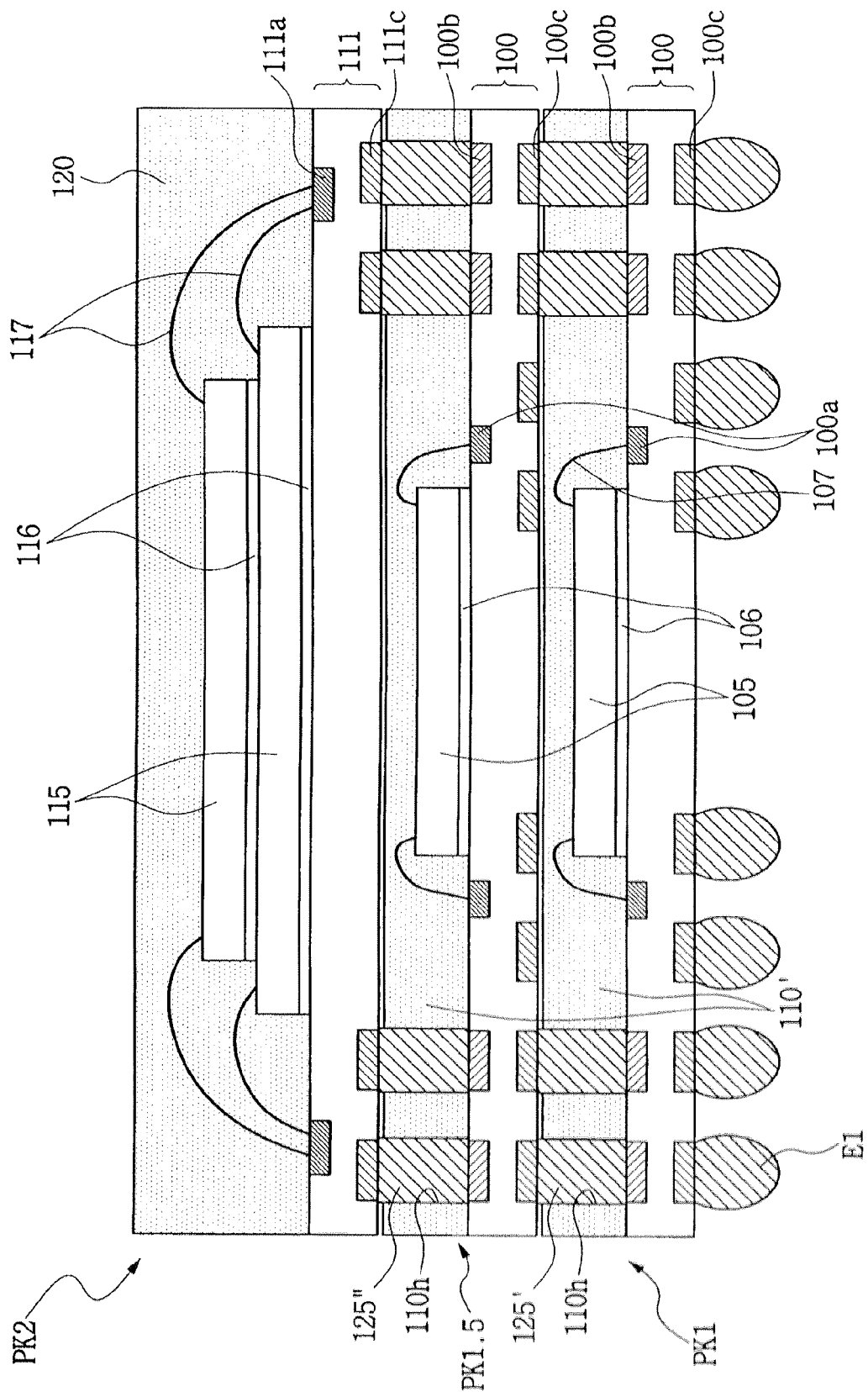
FIG. 4A is a cross-sectional view illustrating a method of forming a stack-type semiconductor package according to other example embodiments of the present general inventive concept.

As illustrated in FIG. 4A, example embodiments of the present general inventive concept may further include stacking one or more intermediate chip packages PK1.5 between the lower chip package PK1 and the upper chip package PK2 using connection conductors 125''.

In addition, as illustrated in FIG. 4B, in the example embodiments of the present general inventive concept, first chips 105' may be electrically connected to the printed circuit board 100 in the flip-chip structure. Furthermore, the cross-sectional view of a connection conductor 125''' filling a via hole 110' may be formed in a shape of a reversed trapezoid.

As described above, the present embodiment has a structure, in which the lower molded resin compound 110' of the lower chip package PK1 covers the lower printed circuit board 100 other than the regions of the ball lands 100b for connection, and as illustrated in FIG. 4B, a side gate transfer mold method may be applied to the present embodiment. Therefore, a problem in the conventional top gate mold method, in which the molded resin compound is applied to the chip region only, i.e., a limit of air-vent design can be overcome in the present general inventive concept.

Moreover, when the upper chip package PK2 is stacked on the lower chip package PK1, the upper solder balls 125 of the upper chip package PK2 are mounted on the via holes 110h of the lower chip package PK1, so that a stack defect caused by misalign may be prevented. Also, the upper solder balls 125 are reflown to fill the via holes 110h and the upper chip package PK2 and the lower chip package PK1 are bonded by the connection conductors 125', so that ball bridge and joint crack defects, which are caused by solder balls in the conventional art, can be prevented.

Further, when the lower printed circuit board 100 becomes thin in order to lower the POP thickness, in the conventional art, the molded resin compound covers only a center portion of the lower chip package, and thus pattern crack phenomena occur at an edge region of the molded resin compound due to stress during a bending test in an assembly and test process. However, in the present embodiment, since the overall lower printed circuit board 100 is covered with the molded resin compound 110', resistance to stress that is caused during the bending test can be obtained. Accordingly, thin thickness of the lower printed circuit board 100 can implement the POP structure having a thin profile.

Figure 5:
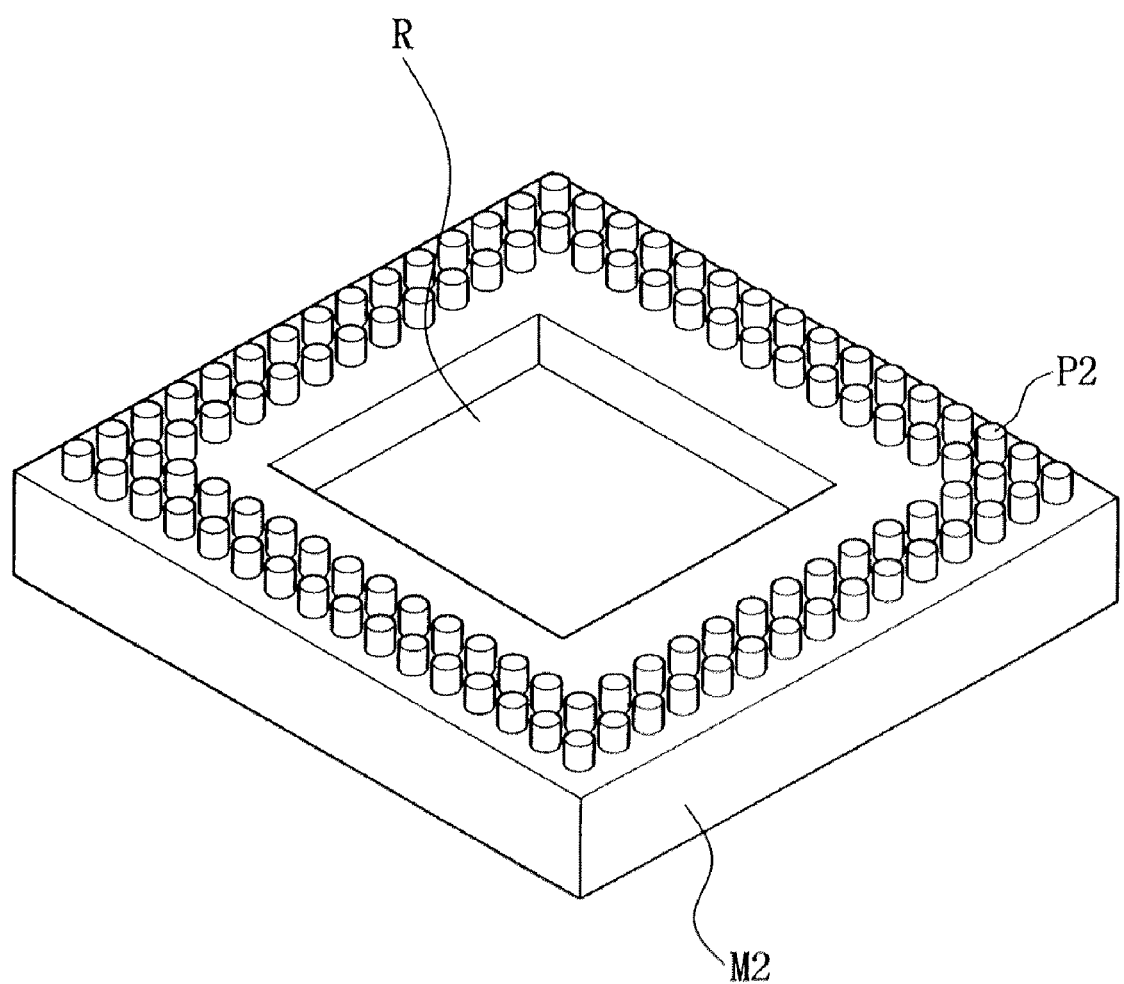
FIG. 5 is a perspective view of a mold to form a lower molded resin compound in a method of forming a stack-type semiconductor package according to still other example embodiments of the present general inventive concept.

FIG. 5 is a perspective view of a mold to form a lower molded resin compound in a method of forming a stack-type semiconductor package according to other example embodiments of the present general inventive concept. Also, FIGS. 6A to 6E are cross-sectional views taken along line I-I' of FIG. 1, illustrating a method of forming a stack-type semiconductor package according to other example embodiments of the present general inventive concept.

Figure 6A:
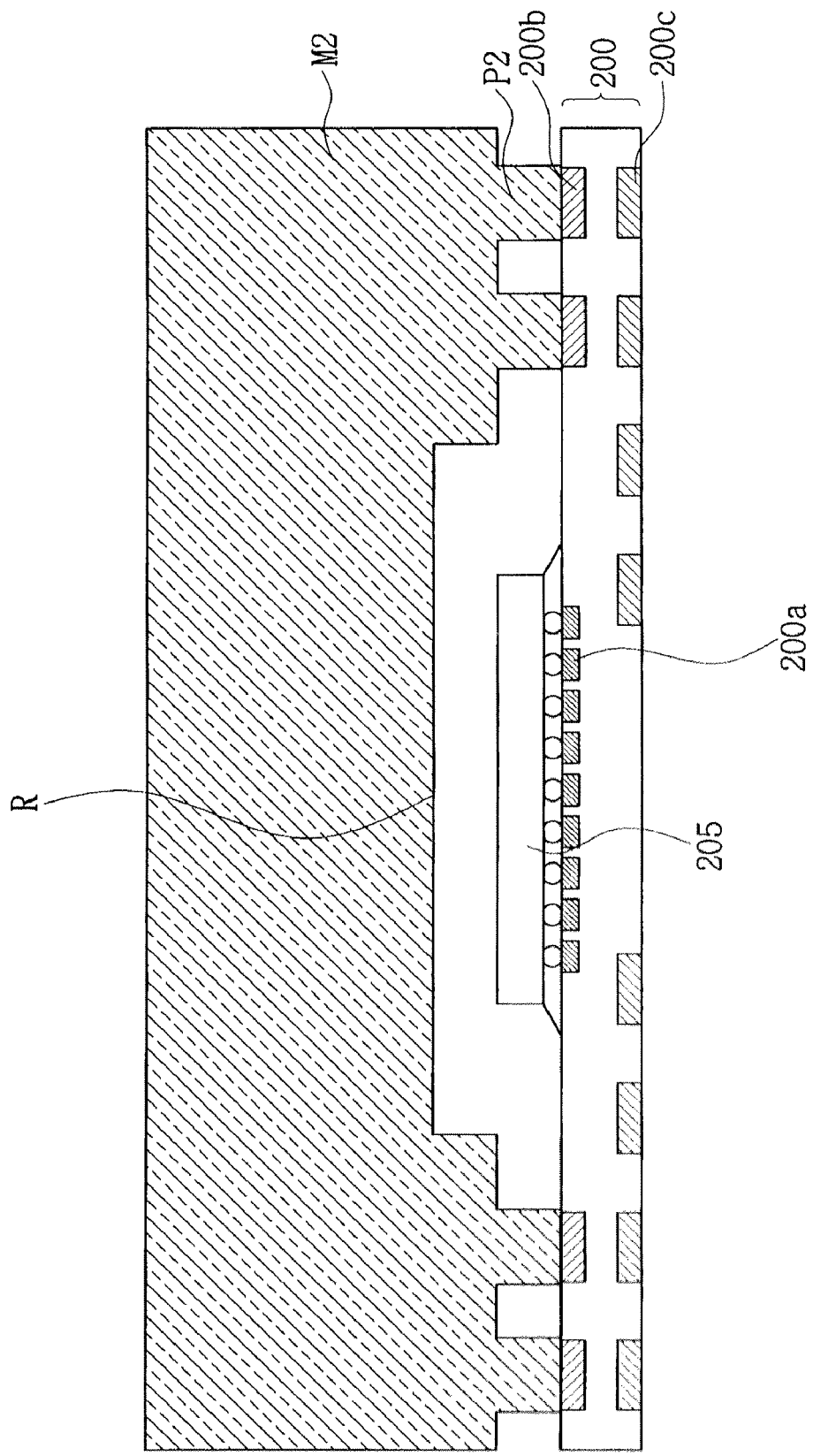
FIGS. 6A to 6E are cross-sectional views taken along line I-I' of FIG. 1, illustrating a method of forming a stack-type semiconductor package according to still other example embodiments of the present general inventive concept.

Referring to FIGS. 1, 5, and 6A, a method of forming a stack-type semiconductor package according to example embodiments of the present general inventive concept includes preparing a lower printed circuit board 200 having a plurality of interconnections 200a and a plurality of ball lands 200b for connection on an upper surface thereof. The lower printed circuit board 200 may further include lower pads 200c on a lower surface. One or more first chips 205 that are sequentially stacked are mounted on the upper surface of the lower printed circuit board 200. The first chips 205 may be electrically connected to the plurality of interconnections 200a formed on the lower printed circuit board 200 in a flip-chip structure. Alternatively, as illustrated in FIG. 3A, pads of the first chips 205 may be electrically connected to the plurality of interconnections 200a formed on the lower printed circuit board 200 through wires.

A mold M2 having a plurality of pins P2 illustrated in FIG. 5 is covered on the lower printed circuit board 200 having the first chips 205. The mold M2 having a plurality of pins P2 may be fabricated such that the ball lands 200b for connection of the lower printed circuit board 200 are aligned with the pins P2. Accordingly, the pins P2 can be in contact with the ball lands 200b for connection of the lower printed circuit board 200, respectively. The pins P2 may have a circular, oval, rectangular, hexagonal or diamond shape when viewed from a plan view. Also, when viewed from a cross-sectional view, the pins P2 may have a shape of a rectangle or a reversed trapezoid. Cylindrical pins P2 are illustrated in FIG. 5 as an example embodiment of the present general inventive concept. A plate of the mold M2 may have a recessed region R between the pins P2. Alternatively, the plate of the mold M2 may have a planar surface. In the present example embodiment, the plate of the mold M2 is fabricated to have a recessed region R between the pins P2, and as illustrated in FIG. 6, a recessed region R may be aligned on the first chips 205.

Figure 6B:
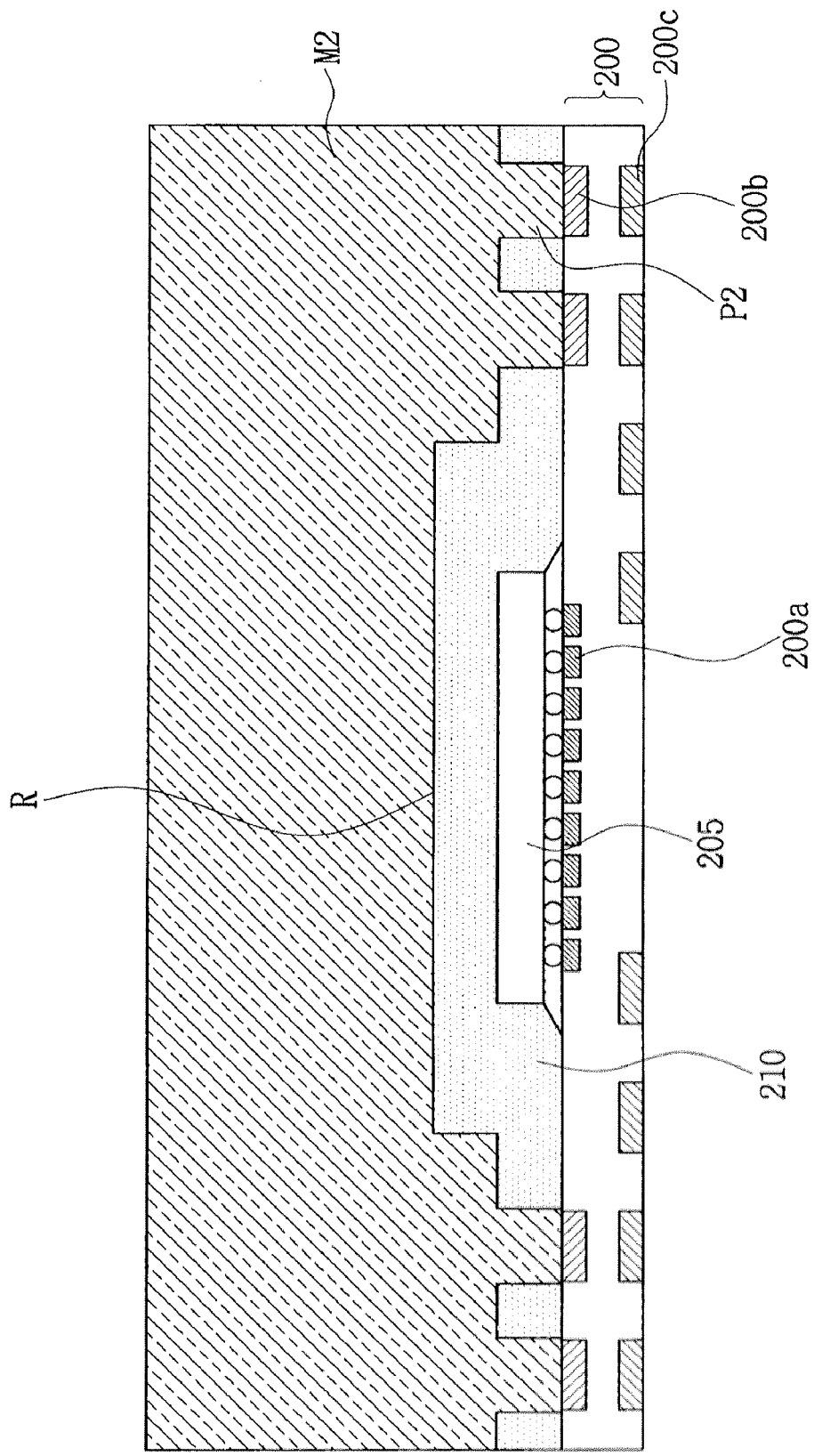

Referring to FIGS. 1, 5 and 6B, a molten lower molded resin compound 210 may be injected into one side of the mold M2. The molten lower molded resin compound 210 may include an epoxy molded compound or liquid epoxy. The molten lower molded resin compound 210 may flow in an opposite direction where the molten lower molded resin compound 210 is injected to fill spaces between the lower printed circuit board 200 and the mold M2. Here, air can go out through the vent. The molten lower molded resin compound 210 fills every empty space between the pins P2 and the recessed region R.

Figure 6C:
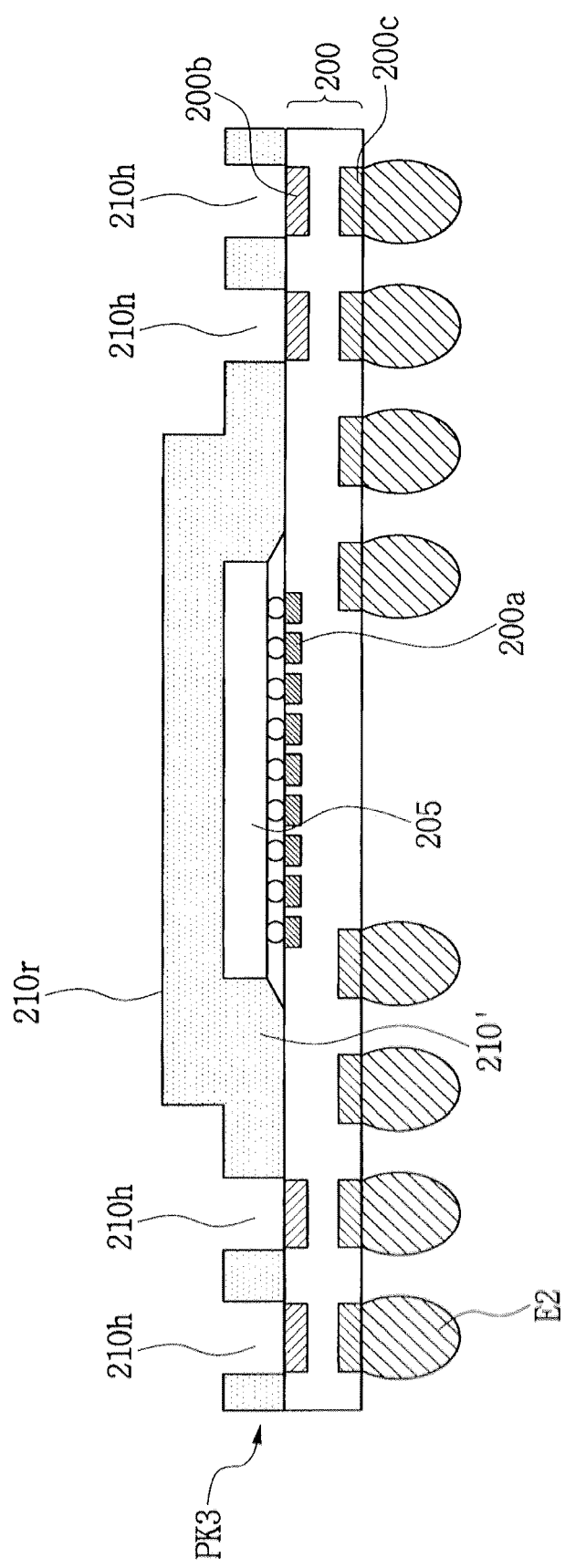

Referring to FIGS. 1, 6B and 6C, the molten lower molded resin compound 210 may be hardened to form a hard lower molded resin compound 210'. The, the mold M2 having the pins P2 and the recessed region R may be removed. As a result, via holes 210h passing through the lower molded resin compound 210' and exposing each of the balls lands 200b for connection of the lower printed circuit board 200 may be formed. A shape of the via holes 210h may be determined depending on a shape of the pins P2. An upper surface of the lower molded resin compound 210' may be formed to have a step difference by the recessed region R of the mold M2. In particular, upper region 210r of the lower molded resin compound 210' corresponding to the first chips 205 may be formed to have upper surfaces higher than other regions.

Electrodes E2 may be formed to be in contact with the lower pads 200c of the lower printed circuit board 200. The electrodes E2 may be formed of solder balls. The lower printed circuit board 200, the first chips 205, and the lower molded resin compound 210' may constitute a lower chip package PK3.

Figure 6D:
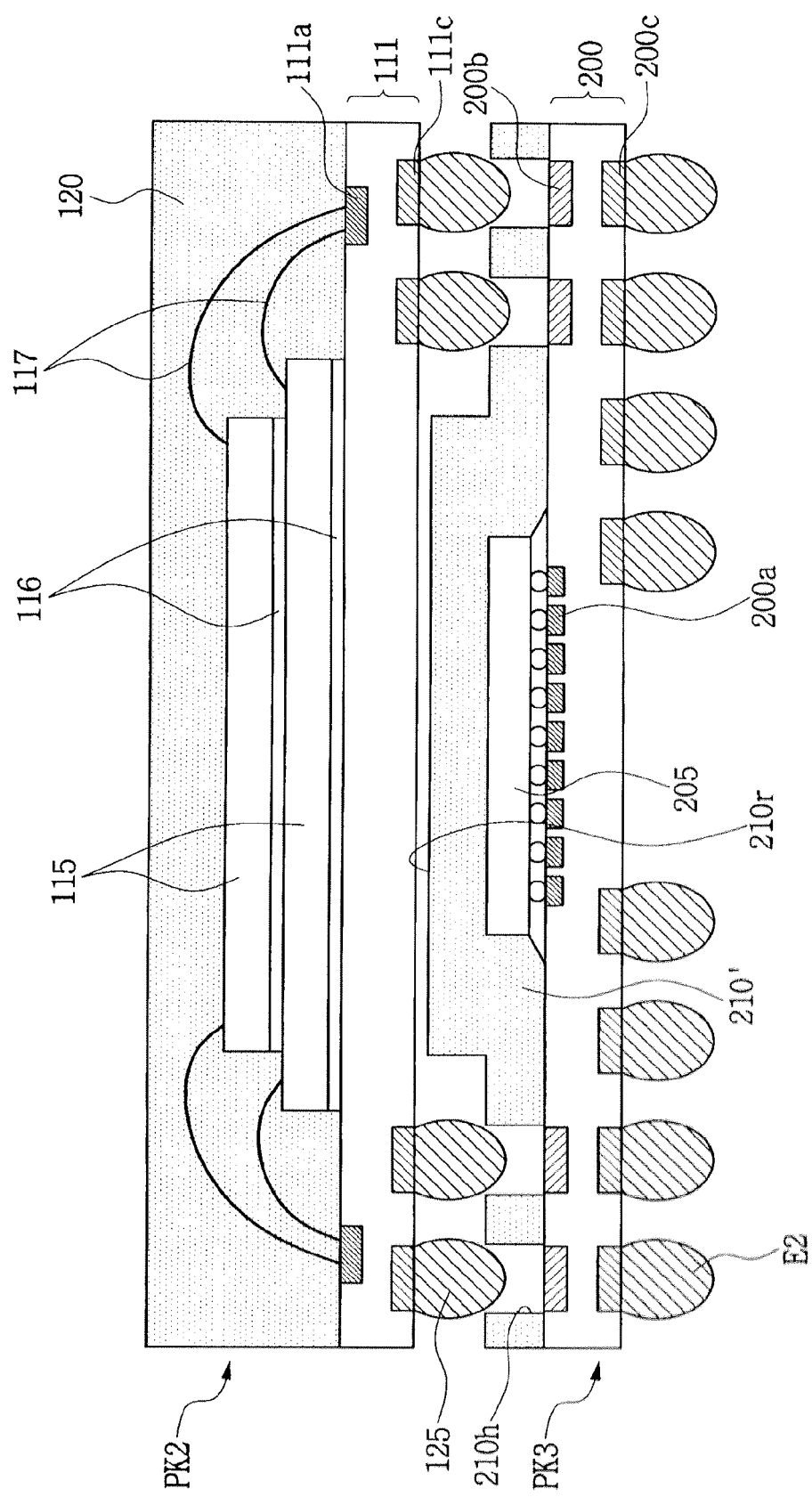

Referring to FIGS. 1 and 6D, the solder balls 125 of an upper chip package PK2, under which the upper solder balls 125 are mounted, may be aligned to correspond to the via holes 210h of the low chip package PK3, respectively. A formation of the upper chip package PK2 may include preparing an upper printed circuit board 111 including lower pads 111c and interconnections 111a. Sequentially, one or more second chips 115, which are electrically connected to the upper printed circuit board 111 and sequentially stacked, may be formed on the upper printed circuit board 111.

Backside surfaces of the second chips 115 may be in contact with an upper surface of the upper printed circuit board 111 through adhesives 116. Then, pads of the second chips 115 may be electrically connected to the plurality of interconnections 111a formed on the upper printed circuit board 111 through wires 117. Alternatively, the second chips 115 may be electrically connected to the upper printed circuit board 111 in a flip-chip structure. An upper molded resin compound 120 covering the upper printed circuit board 111 having the second chips 115 may be formed. The upper solder balls 125 may be formed on the lower pads 111c, respectively. The upper solder balls 125 may be formed of a material containing Sn.

Figure 6E:
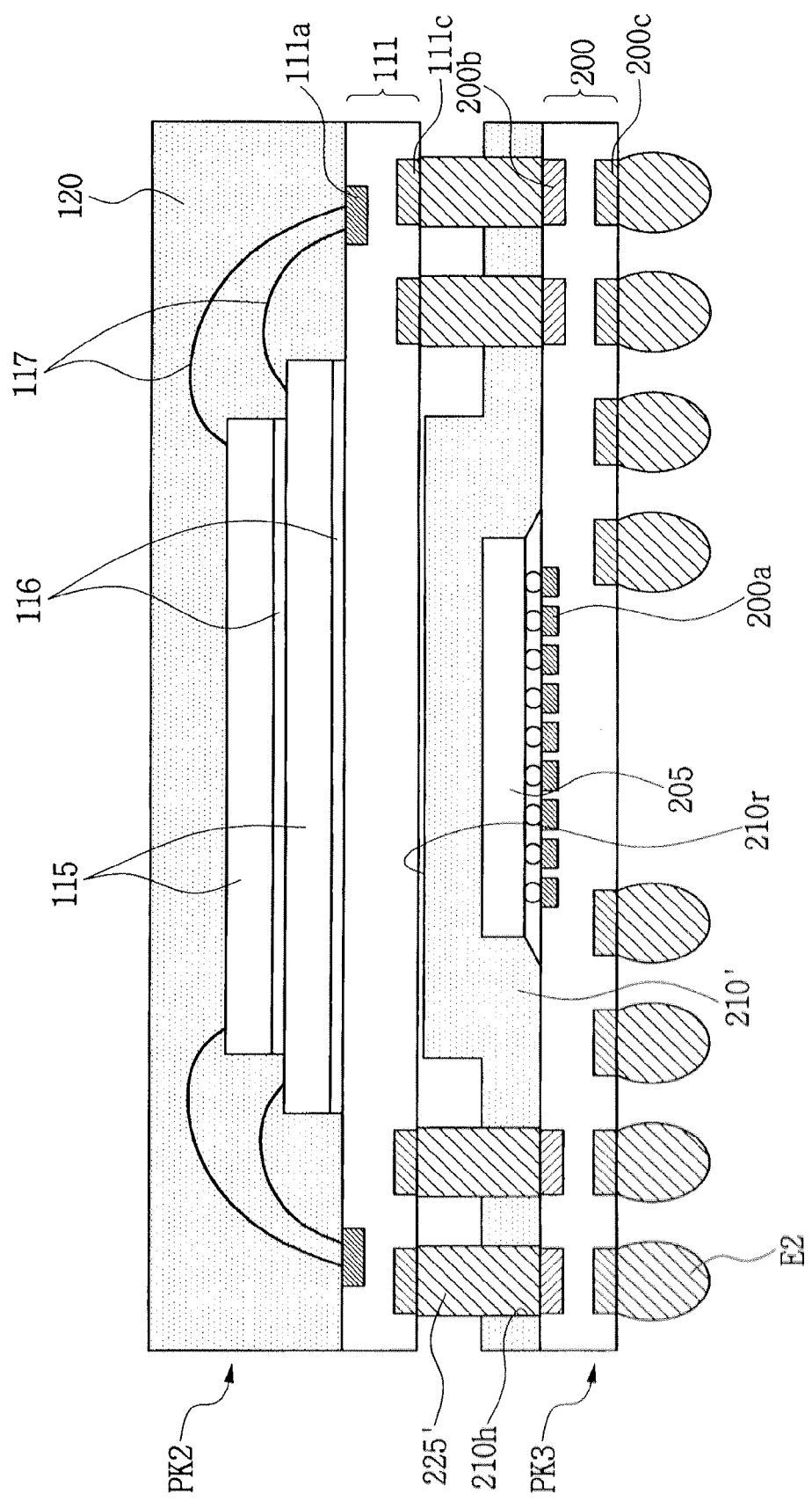

Referring to FIGS. 1 and 6E, the upper solder balls 125 may be reflown to form connection conductors 225' filling the via holes 210h. A stack-type semiconductor package having the POP structure, in which the lower chip package PK3 and the upper chip package PK2 are electrically connected to each other by the connection conductors 225', may be formed. The upper chip package PK2 may be in direct contact with an upper surface of the lower molded resin compound 210' of the lower chip package PK3 depending on an amount of the upper solder balls 125. Alternatively, when an amount of the upper solder balls 125 is sufficient to fill the via holes 210h, and thus remains, the upper chip package PK2 may be disposed to be spaced apart from the upper surface of the lower molded resin compound 210'.

As described above, the present embodiment has a structure, in which the lower molded resin compound 210' of the lower chip package PK3 covers the lower printed circuit board 200 other than the regions of the ball lands 200b for connection, and as illustrated in FIG. 6B, a side gate transfer mold method may be applied to the present embodiment. Therefore, a problem in the conventional top gate mold method, in which the molded resin compound is applied to the chip region only, i.e., a limit of air-vent design can be overcome in the present embodiment.

Moreover, when the upper chip package PK2 is stacked on the lower chip package PK3, the upper solder balls 125 of the upper chip package PK2 are mounted on the via holes 210h of the lower chip package PK3, so that stack defects caused by misalign may be prevented. Also, the upper solder balls 125 are reflown to fill the via holes 210h and the upper chip package PK2 and the lower chip package PK1 are bonded by the connection conductors 225' so that ball bridge and joint crack defects, which are caused by solder balls in the conventional art, can be prevented.

Further, when the lower printed circuit board 200 becomes thin in order to lower the POP thickness, in the conventional art, the molded resin compound covers only a center portion of the lower chip package, and thus pattern crack phenomena occur at an edge region of the molded resin compound due to stress during a bending test in an assembly and test process. However, in the present embodiment, since an overall lower printed circuit board 200 is covered with the molded resin compound 210', resistance to stress that is caused during the bending test can be obtained. Accordingly, thin thickness of the lower printed circuit board 200 implements the POP structure having a thin profile.

Referring again to FIGS. 1 and 3E, a stack-type semiconductor package according to example embodiments of the present general inventive concept will be described below.

Referring to FIGS. 1 and 3E, a stack-type semiconductor package according to example embodiments of the present general inventive concept includes a lower printed circuit board 100 having a plurality of interconnections 100a and a plurality of ball lands 100b for connection on an upper surface thereof. The lower printed circuit board 100 may further include lower pads 100c on a lower surface thereof. One or more first chips 105 that are sequentially stacked are disposed on the lower printed circuit board 100. Backside surfaces of the first chips 105 may be in contact with an upper surface of the lower printed circuit board 100 through an adhesive 106. Sequentially, pads of the first chips 105 may be electrically connected to the plurality of interconnections 100a disposed on the lower printed circuit board 100 through wires 107. Alternatively, the first chips 105 may be electrically connected to the lower printed circuit board 100 in a flip-chip structure.

A lower molded resin compound 110' is disposed on the lower printed circuit board 100 to cover the first chips 105. The lower molded resin compound 110' may include an epoxy molded compound. The lower molded resin compound 110' may include a planar upper surface. Alternatively, the upper surface of the lower molded resin compound 110' may have a step difference. In particular, upper region of the lower molded resin compound 110' corresponding to the first chips 105 may be formed to have upper surfaces higher than other regions.

Connection conductors 125' passing through the lower molded resin compound 110' to be in contact with the ball lands 100b for connection may be disposed. The connection conductors 125' are disposed to fill via holes 110h that pass through the lower molded resin compound 110' and expose the ball lands 100b for connection. The connection conductors 125' may have a circular, oval, rectangular, hexagonal or diamond shape when viewed from a plan view. Also, the connection conductors 125' may have a shape of a rectangle or a reversed trapezoid. The connection conductors 125' may be a material containing Sn.

Electrodes E1 may be disposed to be in contact with the lower pads 100c of the lower printed circuit board 100. The electrodes E1 may have a solder ball structure. The lower printed circuit board 100, the first chips 105, and the lower molded resin compound 110' may constitute a lower chip package PK1.

An upper chip package PK2 that is in contact with an upper surface of the connection conductor 125' is disposed on the lower chip package PK1. The upper chip package PK2 may include an upper printed circuit board 111 having lower pads 111c and interconnections 111a. The connection conductors 125' may be in direct contact with the lower pads 111c of the upper chip package PK2.

One or more second chips 115, which are electrically connected to the upper printed circuit board 111 and sequentially stacked, may be disposed on the upper printed circuit board 111. Backside surfaces of the second chips 115 may be in contact with an upper surface of the upper printed circuit board 111 through adhesives 116. Then, pads of the second chips 115 may be electrically connected to the plurality of interconnections 111a formed on the upper printed circuit board 111 through wires 117. Alternatively, the second chips 115 may be electrically connected to the upper printed circuit board 111 in a flip-chip structure. An upper molded resin compound 120 covering the upper printed circuit board 111 having the second chips 115 may be disposed.

A stack-type semiconductor package having a POP structure, in which the lower chip package PK1 and the upper chip package PK2 are electrically connected to each other by the connection conductors 125', may be formed. The upper chip package PK2 may be in direct contact with an upper surface of the lower molded resin compound 110' of the lower chip package PK1. Alternatively, the upper chip package PK2 may be disposed to be spaced apart from the upper surface of the lower molded resin compound 110'.

As illustrated in FIG. 4A, in example embodiments of the present general inventive concept, one or more intermediate chip packages PK1.5 may be electrically connected and stacked between the lower chip package PK1 and the upper chip package PK2 by intermediate connection conductors 125".

In addition, as illustrated in FIG. 4B, in the example embodiments of the present general inventive concept, first chips 105' may be electrically connected to the printed circuit board 100 in the flip-chip structure. Furthermore, a cross section of a connection conductor 125''' filling a via hole 110' may have the shape of a reversed trapezoid.

Referring again to FIGS. 1 and 6E, a stack-type semiconductor package according to other example embodiments of the present general inventive concept will be described below.

Referring to FIGS. 1 and 6E, a stack-type semiconductor package according to the example embodiments of the present general inventive concept includes a lower printed circuit board 200 having a plurality of interconnections 200a and a plurality of ball lands 200b for connection on an upper surface thereof. The lower printed circuit board 200 may further include lower pads 200c on a lower surface thereof. One or more first chips 205 that are sequentially stacked may be disposed on the lower printed circuit board 200. Pads of the first chips 205 may be electrically connected to the plurality of interconnections 200a disposed on the lower printed circuit board 200 in a flip-chip structure. Alternatively, as illustrated in FIG. 3E, the pads of the first chips 205 may be electrically connected to the plurality of interconnections 200a disposed on the lower printed circuit board 200 through wires.

A lower molded resin compound 210' may be disposed on the lower printed circuit board 200 to cover the first chips 205. The lower molded resin compound 210' may include an epoxy molded compound. An upper surface of the lower molded resin compound 210' may have a step difference. In particular, upper regions 210r of the lower molded resin compound 210' corresponding to the first chips 205 may have upper surfaces higher than other regions. Alternatively, the lower molded resin compound 210' may have a planar upper surface.

Connection conductors 225' in contact with the ball lands 200b for connection through the lower molded resin compound 210' are disposed. The connection conductors 225' may be disposed to fill via holes 210h, which pass through the lower molded resin compound 210' and expose the ball lands 200b for connection. The connection conductors 225' may extend upward. The connection conductors 225' may have a circular, oval, rectangular, hexagonal or diamond shape when viewed from a plan view. Also, the connection conductors 225' may have the shape of a rectangle or a reversed trapezoid. The connection conductors 225' may be formed of a material containing Sn.

Electrodes E2 may be disposed to be in contact with the lower pads 200c of the lower printed circuit board 200. The electrodes E2 may have a solder ball structure. The lower printed circuit board 200, the first chips 205, and the lower molded resin compound 210' may constitute a lower chip package PK3.

An upper chip package PK2 that is in contact with upper surfaces of the connection conductors 225' may be disposed on the lower chip package PK3. The upper chip package PK2 may include an upper printed circuit board 111 having lower pads 111c and interconnections 111a. The connection conductors 225' may be in direct contact with the lower pads 111c of the upper chip package PK2.

One or more second chips 115, which are electrically connected to the upper printed circuit board 111 and sequentially stacked on the upper printed circuit board 111, may be disposed on the upper printed circuit board 111. Backside surfaces of the second chips 115 may be in contact with an upper surface of the upper printed circuit board 111 through adhesives 116. Then, pads of the second chips 115 may be electrically connected to the plurality of interconnections 111a formed on the upper printed circuit board 111 through wires 117. Alternatively, the second chips 115 may be electrically connected to the upper printed circuit board 111 in a flip-chip structure. An upper molded resin compound 120 covering the upper printed circuit board 111 having the second chips 115 may be disposed.

A stack-type semiconductor package having a POP structure, in which the lower chip package PK3 and the upper chip package PK2 are electrically connected to each other by the connection conductors 225', may be formed. The upper chip package PK2 may be in direct contact with an upper surface of the lower molded resin compound 210' of the lower chip package PK3 or the upper chip package PK2 may be disposed to be spaced apart from the upper surface of the lower molded resin compound 210'.

One or more intermediate chip packages (not illustrated) may be electrically connected to each other and stacked between the lower chip package PK3 and the upper chip package PK2 by an intermediate connection conductor.

Figure 7:
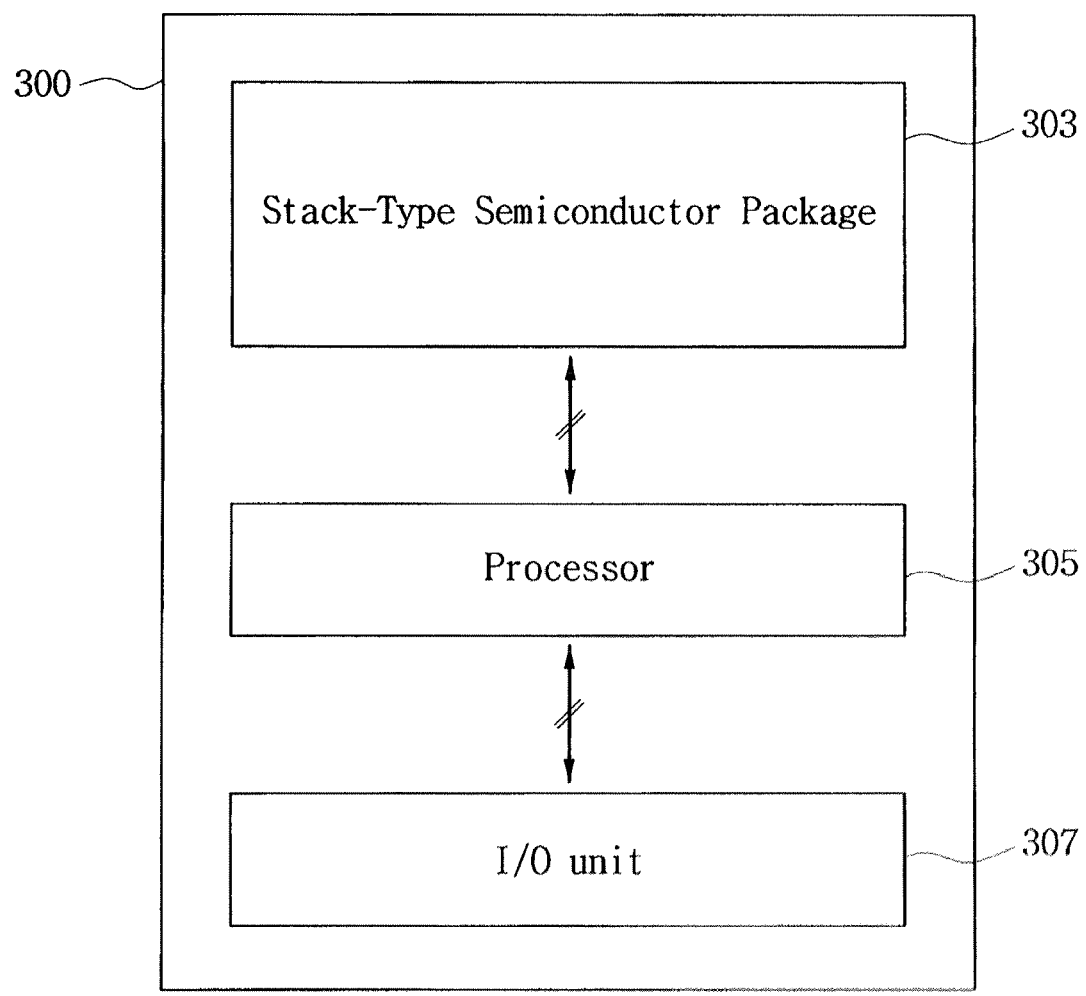
FIG. 7 is a schematic block diagram illustrating an electric system including a stack-type semiconductor package according to example embodiments of the present general inventive concept.

FIG. 7 is a schematic block diagram illustrating an electric system including a stack-type semiconductor package according to example embodiments of the present general inventive concept.

Referring to FIG. 7, the electric system 300 includes one or more stack-type semiconductor packages 303 and a processor 305 connected to the stack-type semiconductor package 303.

Here, the stack-type semiconductor package 303 may include the stack-type semiconductor package, which is described with reference to FIGS. 1, 3E, 4A, 4B, and 6E. For example, as illustrated in FIG. 4A, a lower chip package PK1, an intermediate chip package PK1.5, and an upper chip package PK2 may be electrically connected to each other through connection conductors 125' and 125". The lower chip package PK1 may be a logic package, and the intermediate chip package PK1.5 and the upper chip package PK2 may be memory packages.

The electronic system 300 may correspond to a portion of a notebook computer, a digital camera, MP3, or a cellular phone. In this case, the processor 305 and the stack-type semiconductor package 303 may be installed on a board, and the stack-type semiconductor package 303 may function as data storage media to execute the processor 305.

The electronic system 300 may exchange data with other electric systems such as personal computers or computer networks through an input/output (I/O) unit 307. The input/output unit 307 may provide data with a peripheral bus line of a computer, a high-speed digital transmission line or a wireless transmission/reception antenna. The data communication between the processor 305 and the stack-type semiconductor package 303, and the data communication between the processor 305 and the input/output unit 307 may be established using general bus architectures.

Figure 8:
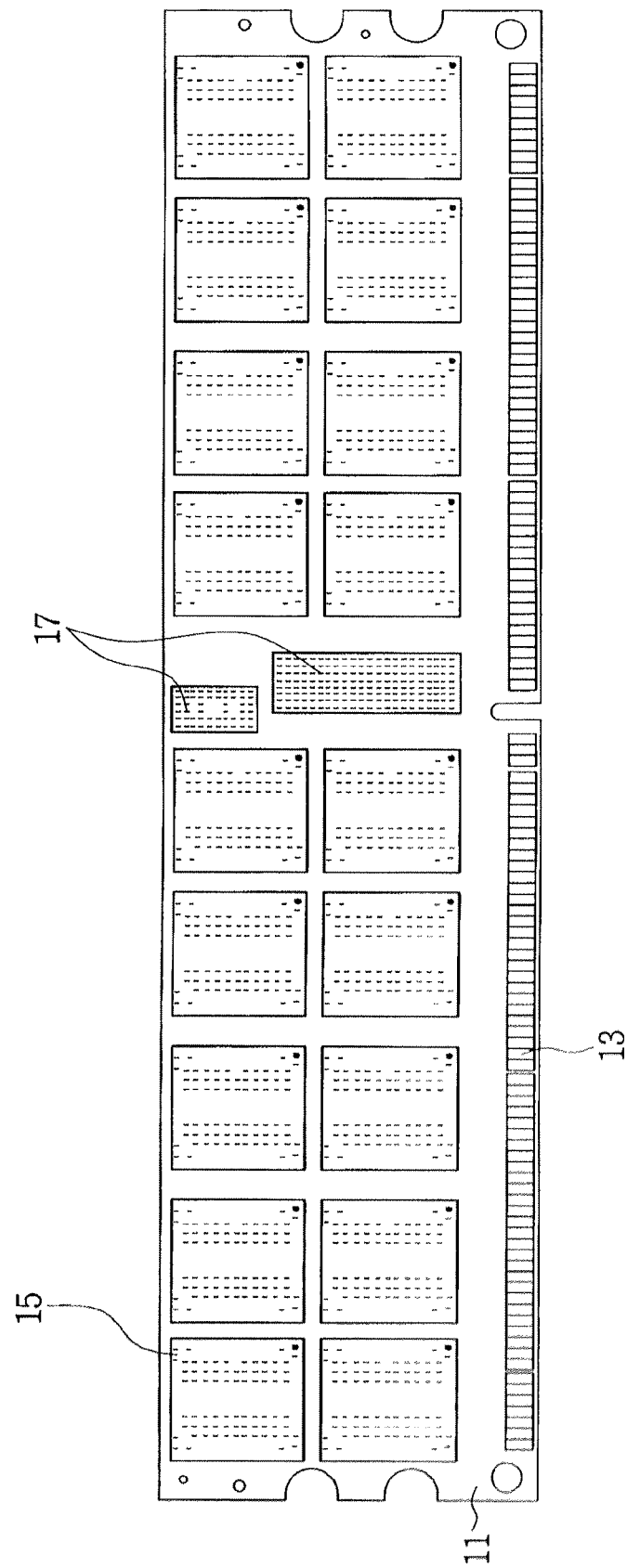
FIG. 8 is a schematic diagram illustrating a memory module, on which a stack-type semiconductor package is mounted, according to example embodiments of the present general inventive concept.

FIG. 8 is a schematic diagram illustrating a memory module, in which a stack-type semiconductor package is mounted according to example embodiments of the present general inventive concept.

Referring to FIG. 8, the memory module includes a board body 11 including a plurality of tabs 13 and a stack-type semiconductor package 15, which is mounted on the board body 11 in an array of two or more columns. Here, the stack-type semiconductor package 303 may include a stack-type semiconductor package, which is described with reference to FIGS. 1, 3E, 4A, 4B and 6E. For example, as illustrated in FIG. 4A, a lower chip package PK1, an intermediate chip package PK1.5, and an upper chip package PK2 are electrically connected to each other through connection conductors 125' and 125". The lower chip package PK1 may be a logic package, and the intermediate chip package PK1.5 and the upper chip package PK2 may be memory packages.

Discrete devices 17 may be mounted on the board body 11. The discrete devices 17 may include at least one selected from the group consisting of a register, a capacitor, an inductor, a resistor, a programmable device, and a non-volatile memory device.

The memory module may be adapted as a data storage device of a plurality of electric systems such as personal computers, system servers, and communication devices. The memory module may be electrically connected to an external connector through the tabs 13 mounted on the board body 11.

Figure 9:
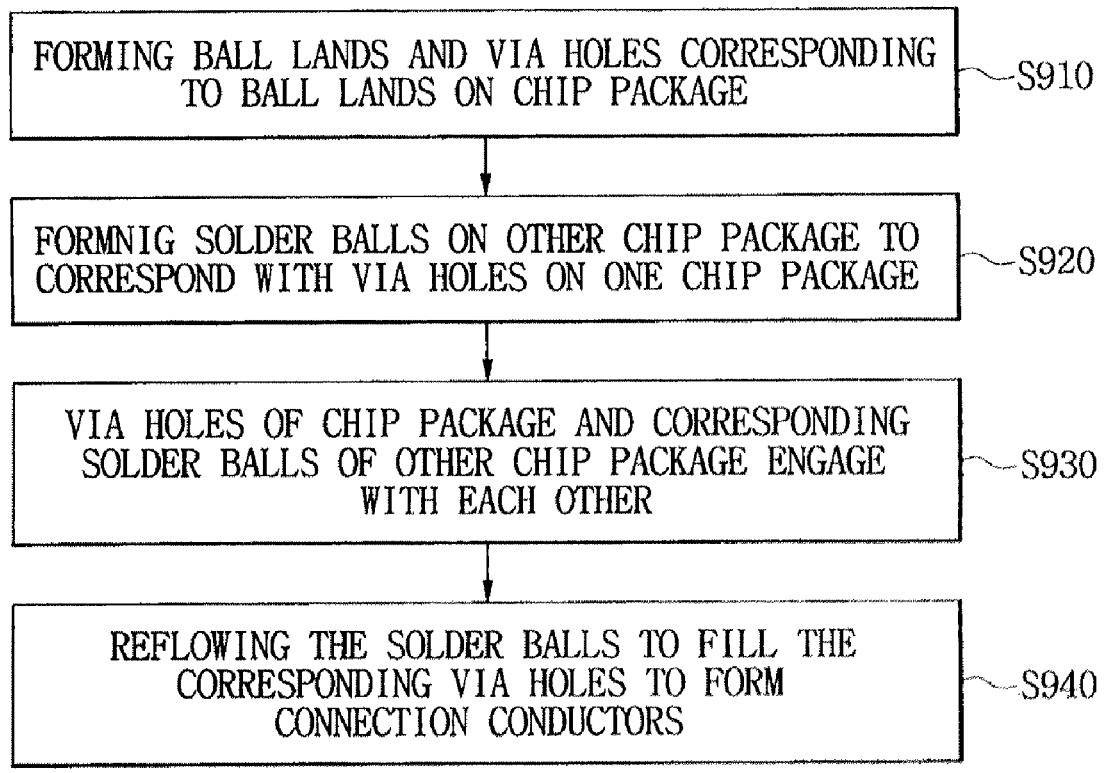
FIG. 9 is a flowchart illustrating a method of forming a stack-type semiconductor package according to an embodiment of the present general inventive concept.

FIG. 9 is a flowchart illustrating a method of forming a stack-type semiconductor package according to an embodiment of the present general inventive concept. Referring to FIG. 9, in operation S910, ball lands and via holes corresponding to the ball lands are formed on a chip package. In operation S920, solder balls are formed on an other chip package to correspond with the via holes on the one chip package. In operation S930, the via holes of the chip package and the corresponding solder balls of the other chip package engage with each other. In operation S940, the solder balls to fill the corresponding via holes are reflown to form connection conductors.

According to the present embodiment, a lower molded resin compound of a lower chip package covers a lower printed circuit board other than the regions of the ball lands for connection, and thus, a side gate transfer mold method may be applied to the present molding method. Therefore, a problem in the conventional top gate mold method, in which the molded resin compound is applied to the chip region only, i.e., a limit of air-vent design is overcome.

Moreover, when an upper chip package is stacked on a lower chip package, solder balls of the upper chip package are mounted on via holes of the lower chip package, so that a stack defect caused by misalign may be prevented. Furthermore, the solder balls are reflown to fill the via holes and the upper chip package and the lower chip package are bonded by connection conductors, so that ball bridge and joint crack defects, which are caused by solder balls in the conventional art, can be prevented.

In addition, when the lower printed circuit board becomes thin in order to lower the POP thickness, in the conventional art, the molded resin compound covers only a center portion of the lower chip package, and thus pattern crack phenomena occur at an edge region of the molded resin compound due to stress during a bending test in an assembly and test process. However, in various embodiments of the present general inventive concept, since the overall lower printed circuit board is covered with the molded resin compound, resistance to stress that is caused during the bending test can be obtained. Accordingly, thin thickness of the lower printed circuit board can implement the POP structure having a thin profile.

Example embodiments of the present general inventive concept have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present general inventive concept as set forth in the following claims.

What is claimed is:

1. A stack-type semiconductor package, comprising:
    a lower printed circuit board comprising interconnections and ball lands on an upper surface of the lower printed circuit board;
    a flip-chip mounted on the upper surface of the lower printed circuit board and electrically connected to the lower printed circuit board;
    a lower resin compound disposed on the lower printed circuit board to surround the flip-chip;
    an upper printed circuit board disposed on the lower printed circuit board, the upper printed circuit board comprising lower pads on a lower surface of the upper printed circuit board and interconnections on an upper surface of the upper printed circuit board;
    via holes formed in the lower resin compound, each of the via holes exposing each of the ball lands and having a top portion adjacent to the upper printed circuit board and a bottom portion adjacent to the lower printed circuit board, and
    solder balls disposed in the via holes, each of the solder balls disposed on each of the ball lands of the lower printed circuit board and being in contact with each of the lower pads of the upper printed circuit board,
    wherein a size of the top portion of one of via holes is larger than a size of the bottom portion of the respective via hole.

2. The semiconductor package of claim 1, wherein a majority portion of each solder ball is disposed in the respective via hole.

3. The semiconductor package of claim 1, wherein each of the solder balls has a first portion not surrounded by the lower resin and a second portion surrounded by the lower resin.

4. The semiconductor package of claim 3, wherein the first portion and the second portion have a substantially same solder ball composition.

5. The semiconductor package of claim 4, wherein the substantially same solder ball composition comprises a substantially same Sn composition in the first portion and the second portion.

6. The semiconductor package of claim 3, further comprises:
- a semiconductor chip mounted on the upper surface of the upper printed circuit board, and
- an upper resin compound covering the semiconductor chip and the upper surface of the upper printed circuit board,
- wherein the lower printed circuit board, the flip-chip and the lower resin compound constitute a lower chip package, and the upper printed circuit board, the semiconductor chip, and the upper resin compound constitute an upper chip package,
- wherein the upper chip package are electrically connected to the lower chip package.

7. The semiconductor package of claim 6, further comprising a plurality of solder balls disposed on a lower surface opposite to the upper surface of the lower printed circuit board.

8. The semiconductor package of claim 6, wherein the lower resin compound has a planar upper surface.

9. The semiconductor package of claim 6, wherein a width of one of the solder balls corresponding to the top portion of one of the via holes is larger than a width of the respective solder ball corresponding to the bottom portion of the respective via hole.

10. The semiconductor package of claim 6, wherein the lower package is a logic package and the upper package is a memory package.

11. A stack-type semiconductor package, comprising:
- a lower printed circuit board comprising interconnections and ball lands on an upper surface of the lower printed circuit board;
- a flip-chip mounted on the upper surface of the lower printed circuit board and electrically connected to the lower printed circuit board;
- a lower resin compound disposed on the lower printed circuit board to surround the flip-chip;
- an upper printed circuit board disposed on the lower printed circuit board, the upper printed circuit board comprising lower pads on a lower surface of the upper printed circuit board and interconnections on an upper surface of the upper printed circuit board;
- via holes formed in the lower resin compound, each of the via holes exposing each of the ball lands and having a top portion adjacent to the upper printed circuit board and a bottom portion adjacent to the lower printed circuit board, and
- solder balls disposed in the via holes, each of the solder balls disposed on each of the ball lands of the lower printed circuit board and being in contact with each of the lower pads of the upper printed circuit board,
- wherein a size of the top portion of one of via holes is larger than a size of the bottom portion of the respective via hole,
- wherein one of the solder balls has a first width corresponding to the top portion and a second width corresponding to the bottom portion, the first width being larger than the second width.

12. An electronic system including an input/output unit and one or more stack-type semiconductor packages which perform data communication with the input/output unit, the stack-type semiconductor package, comprising:
- a lower printed circuit board comprising interconnections and ball lands on an upper surface of the lower printed circuit board;
- a flip-chip mounted on the upper surface of the lower printed circuit board and electrically connected to the lower printed circuit board;
- a lower resin compound disposed on the lower printed circuit board to surround the flip-chip;
- an upper printed circuit board disposed on the lower printed circuit board, the upper printed circuit board comprising lower pads on a lower surface of the upper printed circuit board and interconnections on an upper surface of the upper printed circuit board;
- a semiconductor chip mounted on the upper surface of the upper printed circuit board;
- an upper resin compound covering the semiconductor chip and the upper surface of the upper printed circuit board,
- via holes formed in the lower resin compound, each of the via holes exposing each of the ball lands and having a top portion adjacent to the upper printed circuit board and a bottom portion adjacent to the lower printed circuit board, and
- solder balls disposed in the via holes, each of the solder balls disposed on each of the ball lands of the lower printed circuit board and being in contact with each of the lower pads of the upper printed circuit board,
- wherein a size of the top portion of one of via holes is larger than a size of the bottom portion of the respective via hole,
- wherein each of the solder balls has a first portion not surrounded by the lower resin and a second portion surrounded by the lower resin.

13. The electronic system of claim 12, wherein the lower printed circuit board, the flip-chip and the lower resin compound constitute a lower chip package, and the upper printed circuit board, the semiconductor chip, and the upper resin compound constitute an upper chip package,
- wherein the upper chip package are electrically connected to the lower chip package.

14. The semiconductor package of claim 13, wherein the lower package is a logic package and the upper package is a memory package.

15. The electronic system of claim 13, further comprising a board on which the stack-type semiconductor package is mounted.

16. The electronic system of claim 15, further comprising a data bus for data communication between the input/output unit and the stack-type package.

17. The electronic system of claim 16, further comprising a processor mounted on the board, the processor configured to electrically communicate with the stack-type semiconductor package.

18. The electronic system of claim 12, further comprising a board body including a plurality of tabs at one side,
- wherein at least two of the stack-type semiconductor packages are mounted on the board body in an array of at least two columns.

19. The electronic system of claim 18, further comprising at least one discrete device disposed on the board body to be spaced apart from the stack-type semiconductor packages.

20. The electronic system of claim 19, wherein the at least one discrete device is selected from the group consisting of a register, a capacitor, an inductor, a resistor, a programmable device, a non-volatile memory device and combination thereof.

* * * * *